United States Patent
Altaf et al.

(10) Patent No.: US 12,365,266 B2
(45) Date of Patent: Jul. 22, 2025

(54) METHOD FOR CONTROLLING AN ENERGY STORAGE SYSTEM

(71) Applicant: VOLVO TRUCK CORPORATION, Gothenburg (SE)

(72) Inventors: Faisal Altaf, Västra Frölunda (SE); Anton Klintberg, Torslanda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 551 days.

(21) Appl. No.: 17/416,338

(22) PCT Filed: Dec. 20, 2019

(86) PCT No.: PCT/EP2019/086835
§ 371 (c)(1),
(2) Date: Jun. 18, 2021

(87) PCT Pub. No.: WO2020/128068
PCT Pub. Date: Jun. 25, 2020

(65) Prior Publication Data
US 2022/0063444 A1  Mar. 3, 2022

(30) Foreign Application Priority Data

Dec. 20, 2018  (WO) ................. PCT/EP2018/086329

(51) Int. Cl.
*B60L 58/21* (2019.01)
*B60L 3/00* (2019.01)
(Continued)

(52) U.S. Cl.
CPC ............. *B60L 58/21* (2019.02); *B60L 3/0046* (2013.01); *B60L 58/10* (2019.02); *B60L 58/12* (2019.02);
(Continued)

(58) Field of Classification Search
CPC ........ B60L 58/21; B60L 3/0046; B60L 58/10; B60L 58/12; B60L 58/15; B60L 58/16;
(Continued)

(56) References Cited

U.S. PATENT DOCUMENTS 5,798,633 A * 8/1998 Larsen ...................... H02J 3/38
323/207
10,471,847 B1 * 11/2019 Han .......................... B60L 3/12
(Continued)

FOREIGN PATENT DOCUMENTS

| CN | 102474118 A | 5/2012 |
| CN | 104516394 A | 4/2015 |

(Continued)

OTHER PUBLICATIONS

International Search Report and Written Opinion dated Apr. 9, 2020 in corresponding International PCT Application No. PCT/EP2019/086835, 10 pages.
(Continued)

*Primary Examiner* — Donald J Wallace
*Assistant Examiner* — Jalal C Coduroglu
(74) *Attorney, Agent, or Firm* — Venable LLP; Jeffri A. Kaminski (57) ABSTRACT

The invention relates to a method for management of an energy storage system (ESS) of a vehicle, wherein said vehicle comprises a vehicle control unit (VCU) and an energy storage control management unit (ESCM), wherein said ESS comprises at least two battery units electrically connected in parallel to each other.

19 Claims, 6 Drawing Sheets

Adaptive battery management system (51) Int. Cl.
  *B60L 58/10* (2019.01)
  *B60L 58/12* (2019.01)
  *B60L 58/15* (2019.01)
  *B60L 58/16* (2019.01)
  *B60L 58/22* (2019.01)
  *G01R 31/367* (2019.01)
  *G01R 31/382* (2019.01)
  *G01R 31/3835* (2019.01)
  *G01R 31/389* (2019.01)
  *H01M 10/42* (2006.01)
  *H01M 10/48* (2006.01)
  *H02J 7/00* (2006.01)

(52) U.S. Cl.
  CPC ............ *B60L 58/15* (2019.02); *B60L 58/16* (2019.02); *B60L 58/22* (2019.02); *G01R 31/367* (2019.01); *G01R 31/382* (2019.01); *G01R 31/3835* (2019.01); *G01R 31/389* (2019.01); *H01M 10/425* (2013.01); *H01M 10/482* (2013.01); *H02J 7/0048* (2020.01); *H02J 7/0063* (2013.01); *B60L 2240/545* (2013.01); *B60L 2240/547* (2013.01); *B60L 2240/549* (2013.01); *B60L 2260/44* (2013.01); *H01M 2010/4271* (2013.01); *H01M 2220/20* (2013.01)

(58) Field of Classification Search
  CPC ............ B60L 58/22; B60L 2240/545; B60L 2240/547; B60L 2240/549; B60L 2260/44; B60L 58/14; B60L 3/12; G01R 31/367; G01R 31/382; G01R 31/3835; G01R 31/389; H01M 10/425; H01M 10/482; H01M 2010/4271; H01M 2220/20; H02J 7/0048; H02J 7/0063; Y02E 60/10
  See application file for complete search history.

(56) References Cited

U.S. PATENT DOCUMENTS

| | | | |
|---|---|---|---|
| 2005/0012395 A1* | 1/2005 | Eckroad | H02J 3/1807 307/44 |
| 2005/0275372 A1* | 12/2005 | Crowell | H02J 7/0018 320/112 |
| 2007/0145954 A1 | 6/2007 | Kawahara et al. | |
| 2010/0045112 A1* | 2/2010 | Planes | H02J 7/34 307/48 |
| 2011/0247900 A1* | 10/2011 | Blasko | H02P 27/00 187/247 |
| 2011/0313613 A1 | 12/2011 | Kawahara et al. | |
| 2012/0100399 A1* | 4/2012 | Adachi | H01M 10/46 429/7 |
| 2012/0150247 A1* | 6/2012 | Meier | H01M 10/4207 320/126 |
| 2012/0326671 A1 | 12/2012 | Krause | |
| 2013/0166153 A1* | 6/2013 | Ito | F02D 29/02 701/45 |
| 2014/0129163 A1 | 5/2014 | Betzner | |
| 2014/0152110 A1* | 6/2014 | Sugimoto | H02J 4/00 307/66 |
| 2014/0214348 A1* | 7/2014 | Sahinoglu | G01R 31/3842 702/63 |
| 2014/0239723 A1* | 8/2014 | Beg | H02J 3/46 307/53 |
| 2014/0277879 A1* | 9/2014 | Sheidler | B60W 10/26 180/65.265 |
| 2014/0372053 A1* | 12/2014 | Lin | B60L 58/16 702/63 |
| 2015/0094968 A1* | 4/2015 | Jia | G05B 15/02 702/60 |
| 2016/0036270 A1* | 2/2016 | Smith | H02J 9/061 307/66 |
| 2016/0052410 A1* | 2/2016 | Zhou | B60L 58/20 320/109 |
| 2016/0052418 A1 | 2/2016 | Yang et al. | |
| 2016/0276830 A1* | 9/2016 | Nasirian | G05B 15/02 |
| 2016/0329716 A1* | 11/2016 | Inoue | H02M 7/44 |
| 2016/0330825 A1* | 11/2016 | Recker | H05B 47/115 |
| 2016/0336765 A1* | 11/2016 | Trimboli | H02J 7/0068 |
| 2017/0085091 A1* | 3/2017 | Kamalasadan | H02J 3/00 |
| 2017/0227937 A1* | 8/2017 | Batliner | G01R 31/367 |
| 2018/0094721 A1* | 4/2018 | Lee | F16H 59/52 |
| 2018/0095140 A1* | 4/2018 | Park | G01R 31/367 |
| 2018/0134160 A1 | 5/2018 | Kratzer | |
| 2019/0131923 A1* | 5/2019 | Hooshmand | H02J 3/003 |
| 2019/0148963 A1* | 5/2019 | Nakao | B60L 50/66 320/134 |
| 2020/0164763 A1* | 5/2020 | Holme | B60L 58/16 |
| 2020/0259331 A1* | 8/2020 | Ernest | H02J 3/1842 |
| 2020/0412132 A1* | 12/2020 | Kristjansson | H02J 7/0014 |
| 2022/0161682 A1* | 5/2022 | Byrhult | B60L 58/24 |

FOREIGN PATENT DOCUMENTS

| | | |
|---|---|---|
| CN | 105270389 A | 1/2016 |
| CN | 105324907 A | 2/2016 |
| CN | 107107764 A | 8/2017 |
| DE | 102014216378 A1 | 2/2016 |
| EP | 3011655 A1 | 4/2016 |
| WO | 2014202102 A1 | 12/2014 |
| WO | 2017/215738 A1 | 12/2017 |
| WO | 2018162023 A2 | 9/2018 |

OTHER PUBLICATIONS

Office Action and Search Report, dated Oct. 30, 2023, in corresponding Chinese Application No. 2019-80084006.2, 10 pages.
European Office Action dated Jul. 5, 2024 in corresponding European Patent Application No. 19832963.3, 7 pages.
Chinese Office Action dated Dec. 13, 2024 in corresponding Chinese Patent Application No. 202080088059.4, 20 pages.

* cited by examiner

FIG. 1 Adaptive battery management system

FIG. 2 Single battery model

FIG. 3 Analytical solution using reactive approach

FIG. 4  Battery units connected in parallel

FIG. 5 Zero-Order Model Predictive Approach

FIG. 6 Model predictive power control scheme using Full-order multi-battery model

FIG. 7

METHOD FOR CONTROLLING AN ENERGY STORAGE SYSTEM

CROSS-REFERENCE TO RELATED APPLICATIONS

This application is a U.S. National Stage application of PCT/EP2019/086835, filed Dec. 20, 2019 and published on Jun. 25, 2020, as WO 2020/128068 A1, and PCT/EP2018/086329, filed Dec. 20, 2018 and published on May 9, 2019, as WO 2019/086329 A1, all of which is hereby incorporated by reference in its entirety.

TECHNICAL FIELD

A method for management of an energy storage system (ESS) of a vehicle, wherein the vehicle comprises a vehicle control unit (VCU) and an energy storage control master unit (ESCM), wherein the ESS comprises at least two battery units electrically connected in parallel to each other. The invention also relates to an adaptive battery management system for an energy storage system (ESS) of a vehicle, wherein the vehicle comprises a vehicle control unit (VCU) and an energy storage control master unit (ESCM), the ESS comprising at least two battery units connected in parallel, and to a vehicle comprising an adaptive battery management system.

BACKGROUND

Energy storage systems are frequently used in a wide variety of applications and fields of technology. In the automotive industry, energy storage systems may be used for propulsion of a vehicle as well as for providing electrical energy to various systems of a vehicle.

In order to increase the power capability of the energy storage system, a solution can be provided where two or more battery modules/battery packs of the energy storage system are coupled in parallel to each other. Hereby, the individual battery modules can be easily connected to, or disconnected from, each other. Also, an increased total power capability is provided in comparison to using only a single battery module/battery pack.

However, a problem with energy storage systems having battery modules coupled in parallel is that the battery modules need to be in approximately the same physical state for optimal energy usage. It is however a common scenario that the battery modules/battery packs are not in the same physical state. For example, if the parallel coupled battery modules are differently aged, i.e. one of the battery modules has been recently replaced by a new and unused battery module, there will most likely be a difference in power capability between the differently aged battery modules, which in turn will result in a reduced charge capability and discharge capability for the oldest battery module. Also, care should be taken when mixing battery modules/packs of different generation/types of in a same ESS, since their impedance and OCV characteristics are significantly different from each other. Another example is that if one of the battery modules has a higher temperature than the other battery modules of the same energy storage system, the resistance of the battery module having elevated temperature will most likely be lower than the resistance of the battery modules having lower temperature. In such a situation, there is a risk that the warmer battery module will receive a charge current exceeding its threshold.

Another problem with energy storage systems having parallel coupled battery modules is that different battery packs may be placed in different locations of the vehicle, and may thus require high-voltage cables of different lengths, thereby introducing large differences in resistances.

A typical approach to solve the above-mentioned problem is disclosed in EP 3 011 655, and is based on utilization of the battery units based on constraints dictated by a weakest link in the network, i.e. by the battery pack having the lowest state of power (SOP). The method of EP 3 011 655 uses a substantially conservative approach where the lowest maximum power capability of one of the battery packs is multiplied by the total number of battery packs in order to get the total power capability of the ESS. By using this worst case scenario some of the battery packs may not be fully used i.e., may not deliver/receive power according to their maximum discharge/charge power ability.

However, this control approach has the disadvantage of being quite conservative in terms of utilizing the full potential service of ESS i.e. quality-of-service [QoS] (e.g. power delivery performance as per power demand while ensuring long lifetime) and state-of-utilization [SoU] (e.g. ratio of actual power delivered and potential SOP). Further, the existing solutions use reactive approach. In other words, the charge current is first applied, the feedback is received, and then the current is adjusted. Such a reactive approach exposes batteries to power levels beyond their capabilities for a short time, which may have negative impact on their lifetime.

Another disadvantage of the existing solutions is that power transients are not considered while deciding the power threshold limit. These transients may be significant due to, for example, imbalances in SOC, temperature, capacity, and resistance among batteries. Finally, the existing solutions do not allow for multi-objective optimization. For example, it can be advantageous to lower the power threshold limit momentarily in favour of balancing temperature and state-of-charge among batteries to achieve long term benefits.

There is hence a need for improved controlling of charge and discharge capability for energy storage systems having battery units coupled in parallel.

SUMMARY

The present invention thus provides a method for management of an energy storage system (ESS) of a vehicle, wherein the vehicle comprises a vehicle control unit (VCU) and an energy storage control master unit (ESCM), wherein the ESS comprises at least two battery units electrically connected in parallel to each other, the method comprising the steps of:
a) predicting a first value of SOP(i) of each battery unit (i) independently using single battery model;
b) obtaining a measured load value L(i) of each battery unit (i);
c) calculating a first value of $SOP_{ESS}$ ($SOP_{ESS}^{prel}$) of said ESS using an analytical solution that uses as input said first value of SOP(i) of each battery unit (i) and said measured load value L(i) of each battery unit (i).

The wording "load threshold limit" should in the following and throughout the entire description be interpreted as a load limit which is not exceeding the load limit of the battery unit having lowest maximum SOP. Also, the SOP can be measured by means of power or individual values of current and voltage. Accordingly, the present invention should not be construed as limited to measuring only one of power, current or voltage. The skilled person knows that these variables are dependent on each other and receiving a value for one of the variables when measuring one of the other variables is just a manner of simple calculation.

Furthermore, the wording "battery unit" should in the following and throughout the entire description be interpreted to include battery packs, which in themselves may comprise one or more battery modules. Still further, the wording "battery unit" should be understood to also include a unit which may comprise a plurality of battery packs. Accordingly, the wording "battery unit" may be a battery module comprising at least one battery cell, a battery pack which comprises at least two battery modules, as well as a unit which comprises at least two battery packs.

The term "load" is meant to represent current or power, i.e. load current or load power. This term will be used throughout the description in relation to both current and power, and it should be understandable from the context which of these two parameters is meant.

A "load condition" of a battery unit is to be understood as a condition under which energy is supplied to or extracted from the battery unit, that is, the battery unit is charged or discharged by any external load. As an external load is understood e.g. an electrical machine used for propulsion of a vehicle, auxiliary equipment that uses electric energy during operation, or a charging device arranged for supplying the battery unit with energy.

By the term "prediction horizon" is meant a time period from a given instant to a time point in the future. The prediction horizon in the context of the present invention short (1-5 secs, preferably 2-3 secs), medium (5-15 secs, preferably 10-12 secs), and long (15-60 secs, preferably 30-40 secs). Preferably, the prediction horizon is 30-40 sec.

Predicted load value is denoted $\hat{L}(i)$, and may mean either predicted power flow $\hat{P}(i)$ in battery unit (i) at present time instant, or predicted current flow $\hat{I}(i)$ in battery unit (i) at present time instant. The predicted load value $\hat{L}(i)$ is output of full-order multi-battery model, which will be described below.

Measured load value is denoted $L(i)$, and may mean either measured power flow $P(i)$ in battery unit (i) at present time instant, or measured current flow $I(i)$ in battery unit (i) at present time instant.

As used in the context of the present invention, the term SOP(i) may refer to either maximum current capability $I_{max}(i)$ in Amperes or maximum power capability $P_{max}(i)$ in Watts of the battery unit i. Thus, SOP(i) is the measure of predicted maximum load ability of the battery unit (i).

The energy storage system (ESS) is typically a so called high voltage, high energy and high power battery pack. In this context, the term "high voltage" refers to a battery pack of about 400-1000 V. Further, the term "power", as used herein, typically refers to electrical power.

The battery units according to the present invention may be same or different, and may be of lithium-ion or sodium-ion type. A sodium-ion battery typically includes any type of sodium iron battery or sodium ferrite battery.

The battery units are normally managed by a battery management system (BMS), and the method of the present invention may be implemented by the BMS.

According to the method of the present invention, it is possible to calculate a first value of $SOP_{ESS}$ ($SOP_{ESS}^{prel}$) of said ESS using as input the maximum load ability (SOP(i)) and the measured load value $L(i)$ of each battery unit (i) by an analytical solution, which gives a very accurate estimate of the first value of $SOP_{ESS}$ ($SOP_{ESS}^{prel}$). The first value of $SOP_{ESS}$ ($SOP_{ESS}^{prel}$) calculated by the analytical solution according to the present invention may be used for loading the ESS, such that the load distribution between the battery units is optimal, i.e. such that neither of the battery units receive a load that exceeds its maximum load ability.

One of the advantages of the present invention is that the appropriate charge and discharge load for each battery unit is calculated based on model-based predictions without loading the ESS at that level beforehand. The method of the present invention thus results in prolonged life-time of the battery units since the battery units are almost never exposed to loads, such as charge currents, exceeding the load threshold limits.

The ESS of the present invention may be used for electrical propulsion of a vehicle, or for providing electric power to auxiliary loads, such as air conditioning system, pneumatics, or the like.

As mentioned above, an ESS may comprise at least two battery units, e.g. n battery units, wherein n may be up to 10000.

According to step a) of the method of the present invention, a first value of SOP(i) of each battery unit (i) independently is predicted using single battery model as will be described below. By the term "independently" is meant that SOP(i) of each battery unit (i) is predicted as if the battery units were unconnected. SOP value (SOP(i)) of each battery unit independently is predicted using SOP algorithm that uses single battery model along with information about states SoC, SoR, SoQ, and sensor measurements I(i), V(i), and T(i) (current, voltage, temperature of battery unit i) of each battery unit, wherein SOP(i) is the SOP value for the battery unit i. The output of step a) is an SOP vector with n elements where n is the total number of battery units, and element SOP(i) contains maximum power/current capability of battery unit (i) for both charge and discharge. The first value of SOP(i) of each battery unit (i) may be predicted charge/discharge current, $\hat{I}_{Bi,Ch}^{max}$ and $\hat{I}_{Bi,Dch}^{max}$ or predicted charge/discharge power, $\hat{P}_{Bi,Ch}^{max}$ and $\hat{P}_{Bi,Dch}^{max}$.

In the next step b), the measured load value $L(i)$ of each battery unit (i) is obtained, using equipment commonly known in the art. The measured load value $L(i)$ of each battery unit (i) may be current $I_{Bi}(k)$ or power $P_{Bi}(k)$.

In the subsequent step c), a first value of $SOP_{ESS}$ ($SOP_{ESS}^{prel}$) of the ESS is calculated using an analytical solution. This first value $SOP_{ESS}^{prel}$ is a preliminary value of the $SOP_{ESS}$ comprising n battery units i, wherein each of the battery units has predicted maximum load ability SOP(i). The first value of $SOP_{ESS}$ ($SOP_{ESS}^{prel}$) of said ESS may be maximum charge current ability of said ESS, $I_{ESS,Ch}^{max}$ and maximum discharge current ability of said ESS, $I_{ESS,Dch}^{max}$.

When using the analytical solution, a model predictive approach or reactive approach may be used.

When using a reactive approach, the maximum charge current ability at a time instant (k) for the ESS may be calculated as:

$$I_{ESS,Ch}^{max}(k) = n \cdot \min(\delta_i(k) \cdot I_{i,Ch}^{max}(k))$$

wherein n is the number of battery units, $\delta$ is a load sharing factor, and $I_{i,Ch}^{max}$ is the maximum predicted charge current ability (SOP(i)) of the battery unit i.

Analogously, the maximum discharge current ability at a time instant (k) for the ESS may be calculated as:

$$I_{ESS,Dch}^{max}(k) = n \cdot \max(\delta_i(k) \cdot I_{i,Dch}^{max}(k))$$

wherein n is the number of battery units, $\delta$ is a load sharing factor, and $I_{i,Dch}^{max}$ is the maximum discharge current that is allowed to run through the battery unit i.

The load sharing factor δ is calculated in two different ways depending on whether the measured load value is far from the predicted maximum load ability value, since the impedance of the batteries is load dependent.

In particular, $$\delta_i(k) = \begin{cases} \dfrac{I_{avg}(k)}{I_i(k)}, & \text{if condition 1 is fulfilled} \\ C_\delta, & \text{if condition 1 is not fulfilled} \end{cases}$$

wherein $C_\delta$ is a tuning parameter, $C_\delta \in [0,1]$, and $I_{avg}(k)$ is the average current calculated as:

$$I_{avg}(k) = \frac{1}{n}\sum_{i=1}^{n} I_i(k)$$

wherein n is the number of battery units.

Condition 1 is defined as:

$$|I_{avg}| \geq \beta_1 \,\&\, |I_i| \geq \beta_2 \,\&\, (I_i \geq \beta_3 \cdot I_{i,Ch}^{max} \text{ OR } I_i \leq \beta_3 \cdot I_{i,Dch}^{max})$$

wherein $\beta_1$, $\beta_2$, $\beta_3$ are tuning parameters, $\beta_1 \geq 0$, $\beta_2 \geq 0$ and $\beta_3 \in [0,1]$, Load sharing factor means that information about the load distribution between battery units at present time is used as a feedback to determine said first value of $SOP_{ESS}$ ($SOP_{ESS}^{prel}$). The reactive approach uses only actual measured battery current $I_i(k)$ or measured battery power $P_i(k)$ at present time instant for computing load sharing factor.

The advantage of the reactive approach is that estimation of resistance or open circuit voltage (OCV) are not necessary. However, the reactive approach only considers instantaneous values. Moreover, since the impedance of the batteries is load dependent, the load sharing factor bi will be different when the present load is far from the maximum load. Therefore, the load sharing factor according to the ratio is calculated only when measured current in each battery unit is close to either maximum charge current abilities of battery units or their maximum discharge current abilities. Finally, since the reactive approach corrects itself after actual loading of the ESS, this may lead to more frequent violations of limits.

The disadvantages of the reactive approach may to some extent be remedied by using a model predictive approach instead, wherein the model predictive approach may utilize zero-order multi-battery model. In the zero-order multi-battery model, ohmic resistance $R_0$ and OCV estimations are needed. Model predictive approach for calculation of the first value of SOP ($SOP_{ESS}^{prel}$) will be described in greater detail below.

The analytical solution may use as input the following parameters:
  current I(i) of each battery unit I,
  an internal open circuit battery voltage Voc(i) of each battery unit i,
  ohmic resistance $SOR_0(i)$ for each battery unit.

As mentioned above, first value of $SOP_{ESS}$ ($SOP_{ESS}^{prel}$) of said ESS calculated in step c) may be used for loading said ESS (step d). Alternatively, the first value of $SOP_{ESS}$ ($SOP_{ESS}^{prel}$) of said ESS may be used in full-order multi-battery model as will be described below.

When using the full-order multi-battery model, the dynamic power/current distribution among battery units within the ESS is considered, including the most important imbalances that may be present, and also the impact of these imbalances on the performance and the lifetimes of the battery units.

When the first value of $SOP_{ESS}$ ($SOP_{ESS}^{prel}$) of said ESS is used in full-order multi-battery model, the method of the present invention comprises the following steps:
  e) setting a first value of an optimization parameter α;
  f) calculating a second value of $SOP_{ESS}$ ($SOP_{ESS}^{opt}$) of said ESS based on said first value of said optimization parameter α and using as input said first value of $SOP_{ESS}$ ($SOP_{ESS}^{prel}$) of said ESS;
  g) predicting a load distribution between said at least two battery units using a full-order multi-battery model using as input said second value of $SOP_{ESS}$ ($SOP_{ESS}^{opt}$) and obtaining as output a predicted load value $\hat{L}(i)$ of each battery unit (i);
  h) iteratively solving constraint satisfaction problem or multi-objective optimization problem, using as input said first value of SOP(i) and said predicted load value $\hat{L}(i)$ and obtaining as output a third value of $SOP_{ESS}$ ($SOP_{ESS}^{final}$), wherein iterations occur until said first value of SOP(i) of at least one battery unit is equal to maximum of its predicted load value $\hat{L}(i)$ over given prediction horizon, and wherein at each iteration a second value of said optimization parameter α is obtained and used for calculating a new second value of $SOP_{ESS}$ ($SOP_{ESS}^{opt}$) to be used in step g);
  i) communicating said third value of $SOP_{ESS}$ ($SOP_{ESS}^{final}$) value to said vehicle controller;
  j) loading the ESS according to said third value of $SOP_{ESS}$ ($SOP_{ESS}^{final}$).

Thus, in step e), a first value of an optimization parameter α is set. The first value of the optimization parameter α is greater than 0. The first value of the optimization parameter α is used for calculating a second value of $SOP_{ESS}$ ($SOP_{ESS}^{opt}$) in step f), wherein:

$$SOP_{ESS}^{opt} = \alpha \cdot SOP_{ESS}^{prel}$$

If the first value of the optimization parameter α is set to 1, then the first value of $SOP_{ESS}$ is equal to the second value of $SOP_{ESS}$, i.e.

$$SOP_{ESS}^{opt} = SOP_{ESS}^{prel}$$

In the next step g), a load distribution between the battery units is predicted using a full-order multi-battery model using as input the second value of $SOP_{ESS}$ ($SOP_{ESS}^{opt}$) and obtaining as output a predicted load value $\hat{L}(i)$ of each battery unit (i). The full-order multi-battery model is described in greater detail below.

Next, the constraint satisfaction problem or multi-objective optimization problem is iteratively solved in step f), using as input the first value of SOP(i) and the predicted load value $\hat{L}(i)$ and obtaining as output a third value of $SOP_{ESS}$ ($SOP_{ESS}^{final}$), wherein iterations occur until a certain criterion is fulfilled. One example of such criterion may be that the first value of SOP(i) is greater than or equal to the predicted load value $\hat{L}(i)$ over a predefined prediction horizon. At each iteration, a second value of the optimization parameter α is obtained and used for calculating a new second value of $SOP_{ESS}$ ($SOP_{ESS}^{opt}$). If the predicted load value $\hat{L}(i)$ is greater than the first value of SOP(i), it means that the battery unit (i) will receive current or power exceeding the maximum allowed value of current or power of this battery unit. Therefore, iterations occur until the first value of SOP(i) is greater than or equal to the predicted load value $\hat{L}(i)$. It must be noted that the second value of $SOP_{ESS}$ ($SOP_{ESS}^{opt}$) at which the constraint satisfaction problem is solved is denoted as the third value of $SOP_{ESS}$ ($SOP_{ESS}^{final}$).

Once the constraint satisfaction problem is solved and the third value of $SOP_{ESS}$ ($SOP_{ESS}^{final}$) is calculated, steps i)-j) are executed, communicating the third value of $SOP_{ESS}$ ($SOP_{ESS}^{final}$) value to the vehicle controller and loading the ESS according to the third value of $SOP_{ESS}$ ($SOP_{ESS}^{final}$).

In order to solve the problem of optimal load of an ESS, i.e. provide a load of the ESS such that neither of the battery units (i) within the ESS receive a load during charge or discharge exceeding its load threshold limit, it is necessary to consider the dynamic power/current distribution among battery units within the ESS, including the most important imbalances that may be present, and also the impact of these imbalances on the performance and the lifetimes of the battery units.

The solution to the above-mentioned problem is suggested by the method according to steps a)-j), wherein a dynamic state-space model for ESS with parallel-connected batteries is used. This model is scalable and configurable for any number of battery units and takes into consideration connection resistances and ageing information in terms of capacity fade and impedance growth. It allows to do model-based predictions of dynamic load distribution/split among parallel battery units in the ESS, giving insight about the transient and steady-state responses of each individual battery unit. Further, it enables understanding the dynamic interactions (i.e. current circulations) among the battery units and the effect that various internal and external factors may have on the load splitting among the battery units. These model-based predictions enable advanced control design as discussed in detail below.

According to the method according to the steps a)-j), the maximum load capability of complete ESS is achieved using model-based predictions. Thus, the need for using a conservative method based on battery unit having the lowest maximum load capability is eliminated. Instead, individual maximum load capabilities of each battery unit are utilized and then total ESS load capability is optimized subject to system static and dynamic constraints imposed by parallel battery units, thus increasing the overall power capability of the ESS. Further, according to the method of the steps a)-j), it is possible to include various other constraints/objectives, such as temperature and state-of-charge by exploiting available flexibility provided by system configuration and load dynamic response. Some of the parameters that are taken into consideration are: connection cable lengths having known cable resistances, SOC, temperature, and SOH, as will be described in greater detail later. The model used in the method according to the steps a)-j) also helps analyzing imbalance between battery units regarding SOC and temperature and can predict how the battery units will age in the future under natural power distribution.

The method according to the steps a)-j) decides about the load limit based on dynamic load split, i.e. considering both transient and steady-state values of load split among batteries.

These predictions enable more intelligent decision making regarding load threshold limit. For example, using information about transient response including percentage over-shoot, peaking time, settling time etc., it can be decided whether violation of ESS maximum load capability for a short time should be allowed in case where delivering more instantaneous power to driveline for few seconds is prioritized compared to saving battery from stress. This kind of trade-off optimization can be easily achieved or configured based on the model predictive power control approach of the steps a)-j).

A memory unit may be connected to the energy storage system and the method may further comprise the step of providing information relating to the predicted load value L(i) and the third value of $SOP_{ESS}$ $SOP_{ESS}^{final}$ to the memory unit.

Hereby, the memory unit stores the adjusted charge/discharge current as well as the various parameters of the battery units, such as temperature or voltage. An advantage is that when the same, or approximately the same, scenario between the battery units occurs again it may be easier to adjust the charge/discharge current to a desired level, since the memory unit knows how much the charge/discharge current was previously adjusted. Such a scenario may, for example, be when a battery unit is exchanged to a new one. The memory unit may then remember how much charge/discharge current that was applied when previously adjusting to a desired level when changing or discharging battery units.

The method disclosed above may be executed by a control unit, such as an energy storage control master unit (ESCM). The control unit may include a microprocessor, microcontroller, programmable digital signal processor or another programmable device. Thus, the control unit comprises electronic circuits and connections as well as processing circuitry such that the control unit can communicate with different parts of the electric power transmission system and any other parts in need of being operated in order to provide the functions of the example embodiments. Depending on the type of control unit and location of the control unit, the control unit may also be configured to communicate with other parts of the vehicle such as the electrical machines, brakes, suspension, the clutch, transmission and further electrical auxiliary devices, e.g. the air conditioning system, in order to at least partly operate the vehicle. The control unit may comprise modules in either hardware or software, or partially in hardware or software and communicate using known transmission buses such as CAN-bus and/or wireless communication capabilities. The processing circuitry may be a general purpose processor or a specific processor. The control unit typically comprises a non-transistory memory for storing computer program code and data upon. Thus, the control unit may be embodied by many different constructions.

In other words, the control functionality of the example embodiments of the electric power transmission system may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. While the example embodiments of the electric power transmission system described above can include a control unit being an integral part thereof, it is also possible that the control unit may be a separate part of the vehicle, and/or arranged remote from the electric power transmission system and in communication with the electric power transmission system.

The method according to the present invention may comprise the step a0) of receiving a power request from the VCU; wherein step a0 occurs before step a). In this case, the method provides an optimal load of the ESS considering the requested power.

The method according to the present invention may further comprise the steps of:
k) receiving at least one operational parameter from the ESS after loading the ESS according to third value of $SOP_{ESS}$ ($SOP_{ESS}^{final}$), and
l) using the at least one operational parameter as input in the full-order multi-battery model.

In other words, the predicted and actual values of the operational parameters may be compared, and in case of discrepancy, the predictive model may be fine-tuned and model mismatch can be mitigated based on the feedback received from the ESS such that future predictions become more accurate. Thus, the method of the present invention may continuously update the first value of $SOP_{ESS}$ ($SOP_{ESS}^{prel}$) based on the operational parameter obtained after loading the ESS according to the first value of $SOP_{ESS}$ ($SOP_{ESS}^{prel}$). Further, the method of the present invention may continuously update the third value of $SOP_{ESS}$ ($SOP_{ESS}^{final}$) based on the operational parameter obtained after loading the ESS according to the third value of $SOP_{ESS}$ ($SOP_{ESS}^{final}$). The full-order multi-battery model uses as input the following parameters:
number n of battery units i,
state-of-charge SOC(i) of each battery unit i,
temperature T(i) of each battery unit i,
state-of-capacity SOQ(i) of each battery unit i,
state-of-resistance SOR(i) of each battery unit i.

As mentioned above, the method of the present invention may be performed by the ESCM during use of the ESS by the vehicle.

Another aspect of the present invention is an adaptive battery management system for an energy storage system (ESS) of a vehicle, wherein the vehicle comprises a vehicle control unit (VCU) and an energy storage control master unit (ESCM), the ESS comprising at least two battery units connected in parallel, the management system comprising a model for calculating an first $SOP_{ESS}$ value $SOP_{ESS}^{prel}$ for optimal loading of the ESS.

Yet further aspect of the present invention is a computer program comprising program code means for performing the steps of the method described above when the program is run on a computer. The computer program comprising program means for performing the steps of the method described above may be stored on a computer readable medium.

Another aspect of the present invention is an energy storage control master unit (ESCM) configured to perform any one of the steps described above.

Finally, an aspect of the present invention is a vehicle, such as a fully or hybrid electrical vehicle, comprising an adaptive battery management system as described above.

According to one specific embodiment of the present invention, the method for predictive power control of an ESS may comprise the following steps:
a) predicting a first SOP value (SOP(i)) of each battery unit independently using single battery model;
b) obtaining a measured load value L(i) of each battery unit (i);
c) calculating a first value of $SOP_{ESS}$ ($SOP_{ESS}^{prel}$) of said ESS using an analytical solution that uses as input said first value of SOP(i) of each battery unit (i) and said measured load value L(i) of each battery unit (i);
e) setting a value of optimization parameter α, wherein 0≤α≤1;
f) predicting the charge current $\hat{I}(i)$ through each battery unit in the ESS for the first value of $SOP_{ESS}$ ($SOP_{ESS}^{prel}$);
f') calculating $I_{diff}(i)$ according to equation (1):

$$I_{diff}(i)=\hat{I}(i)-I_{max}(i) \qquad (1)$$

wherein $I_{max}(i)$ is the maximum current capability calculated based on the first value of SOP(i) value for an individual battery unit (i) in the ESS;
f") repeating steps c)-c") in case $|I_{diff}(i)|>0$, setting a different value of optimization parameter α in step c);
i) calculating a third value of $SOP_{ESS}$ ($SOP_{ESS}^{final}$) according to equation (2):

$$SOP_{ESS}^{final}=\alpha \cdot SOP_{ESS}^{prel} \qquad (2)$$

j) communicating $SOP_{ESS}^{final}$ value to the vehicle controller, which then loads the ESS accordingly.

It should be noted that $\hat{I}(i)$ correspond to the predicted load value $\hat{L}(i)$. In this particular embodiment, the iterative solution of the constraint satisfaction problem starts with choosing a value of optimization parameter α, such that 0≤α≤1 (step e). Normally, the initial value of α is set to 1. Based on the value of the optimization parameter α, the charge current $\hat{I}(i)$ through each battery unit in the ESS for the $SOP_{ESS}^{prel}$ value is predicted using the full-order multi-battery model (step f). According to step f'), the predicted $\hat{I}(i)$ value for each battery unit is compared with the corresponding maximum charge or discharge current for this battery unit, $I_{max}(i)$, thus obtaining a value of $I_{diff}(i)$, wherein:

$$I_{diff}(i)=\hat{I}(i)-I_{max}(i) \qquad (1)$$

The output of step f') is thus an $I_{diff}$ vector with n elements, where n is the total number of battery units, and element $I_{diff}(i)$ contains a positive or negative value, indicating whether the predicted charge/discharge current exceeds or is lower than the maximum power/current capability of battery unit (i).

Figure 2:
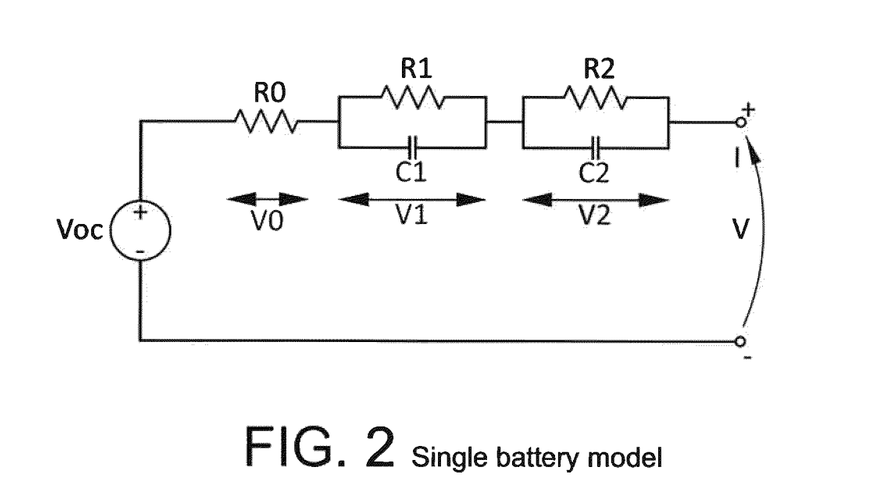
FIG. 2 is a single battery model used for prediction of the first value of SOP(i)

It should be noted that the multi-battery model for both charge and discharge maximum abilities is used separately using $SOP_{ESS}^{prel}$ first for charge, and then for discharge. As may be seen in FIG. 2 and FIG. 5, the analytical solution provides two outputs $I_{ESS,Dch}^{max}$ and $I_{ESS,Ch}^{max}$. In this regard $SOP_{ESS}^{prel}$ should be one of them turn by turn because full-order multi-battery model can predict load distribution only under discharge ability $I_{ESS,Dch}^{max}$ or charge ability $I_{ESS/ch}^{max}$ at a time.

If at least one of the values in the $I_{diff}$ vector is positive, i.e. $|I_{diff}(i)|>0$, the steps c)-c") are repeated, setting a different value of optimization parameter α in step c). The process continues iteratively, adapting the value of optimization parameter α in each iteration, until all the values in the $I_{diff}$ vector are negative or one of them is zero i.e., one predicted value hits its maximum limit, i.e. when none of the predicted charge current values Î(i) exceed maximum allowed charge current value $I_{max}(i)$ for the battery unit (i).

The optimization parameter α value may be a function of the value of $I_{diff}(i)$. Thus, the change in the value of optimization parameter α may be dependent on the value of $I_{diff}(i)$, i.e. on how much the maximum allowed charge current $I_{max}(i)$ is exceeded. For instance, a may, for example, be calculated using the following dynamic recursion:

$$\alpha(j+1) = \min\left(\alpha(j) - \frac{I_{diff}(i)}{I_{max}(i)}\right)$$

assuming that $|I_{diff}(i)| \leq |I_{max}(i)|$.

According to the present invention, the current Î(i) is predicted based on demanded current ($I_{dem}$ or $SOP_{ESS}$), number of battery units n, parallel configuration, connection cable lengths, state-of-charge (SOC) at present time, temperature at present time, and/or present state-of-health (SOH), wherein SOH indicator is computed based on state-of-capacity (SOQ) and state-of-resistance (SOR) functions. The current charge Î(i) may be the predicted current trajectory over prediction horizon "t+T", wherein t is the present real-time and T is prediction time period in future. In other words, the values of SOP(i) and Î(i) are predicted not only for a given instant in time, but also for a period of time adjacent to the given instant, such as 15 s, 30 s or 60 s. Also, the prediction can be made for a longer time period, such as 2-5 min or 15-20 min. The predicted current trajectory comprises both transient and steady-state values.

The example embodiments of the method are particularly useful for vehicles such as electrical vehicles, including partly and fully electrical vehicles, hybrid electrical vehicles, plug-in hybrid electrical vehicles or any other type of electrical vehicle. This type of vehicles typically comprises an electric machine, the battery pack assembly and the battery management unit. The battery pack assembly is configured to provide power to the electrical machine, thereby providing propulsion for the electrical, hybrid, or plug-in hybrid vehicle and/or to power any other type of auxiliary electrical loads in various types of construction equipment.

According to one example embodiment, the electrical vehicle system comprises the measuring sensor unit configured to measure current in ampere. The measuring sensor unit may be any other sensor unit capable of measuring the inflow and outflow of current through the battery pack assembly. These types of sensor units are commonly available and several different options are conceivable.

In addition, or alternatively, the measuring sensor unit may be a voltage sensor configured to measure and calculate the energy throughput. That is, the energy throughput is calculated by integrating or summing the product of current and voltage over time.

As mentioned above, the example embodiments of the method and the sequences of the methods, typically corresponding to the steps of the method, are executed by a control unit.

Thus, according to one example embodiment, the steps of the method are performed by a control unit during use of the battery pack assembly by the electrical vehicle system.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

The above, as well as additional objects, features and advantages of the present invention, will be better understood through the following illustrative and non-limiting detailed description of exemplary embodiments of the present invention, wherein.

With reference to the appended drawings, below follows a more detailed description of embodiments of the invention cited as examples.

DETAILED DESCRIPTION OF EXAMPLE EMBODIMENTS OF THE INVENTION

The present invention will now be described more fully hereinafter with reference to the accompanying drawings, in which exemplary embodiments of the invention are shown. The invention may, however, be embodied in many different forms and should not be construed as limited to the embodiments set forth herein; rather, these embodiments are provided for thoroughness and completeness. The skilled person will recognize that many changes and modifications may be made within the scope of the appended claims.

Similar reference character refer to similar elements throughout the description.

Figure 1:
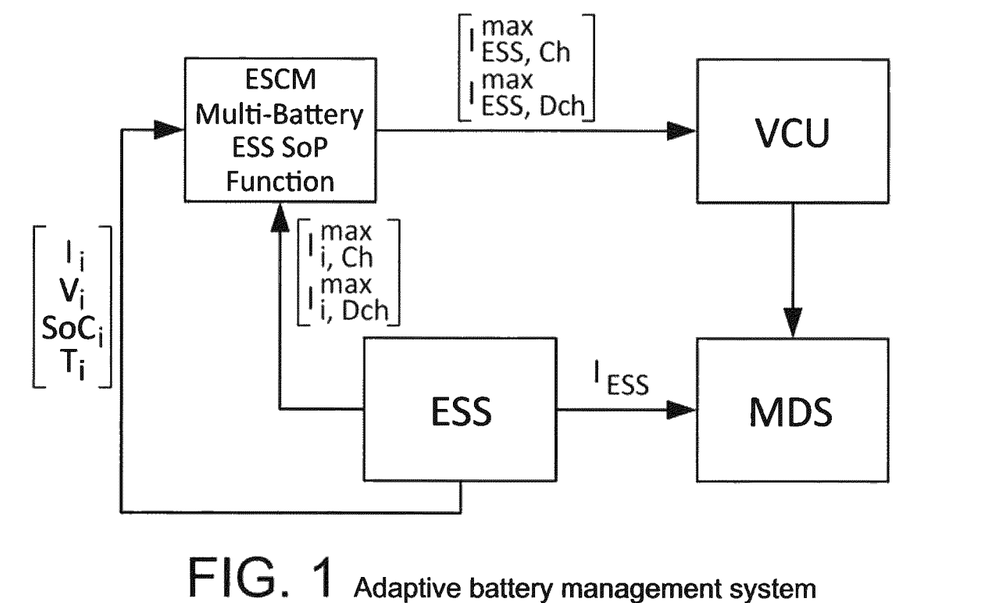
FIG. 1 depicts an adaptive battery management system according to the present invention.

FIG. 1 shows an adaptive battery management system according to the present invention. As may be seen in FIG. 1, the adaptive battery management system comprises an energy storage system (ESS), an energy storage control management unit (ESCM), a vehicle control unit (VCU) and a motor drive system (MDS). $I_i$, $V_i$, $SOC_i$, $T_i$ are measured values of the battery unit (i), also referred to as measured load value L(i). $I_{Bi}^{max}$ is a predicted value of the maximum current ability of the battery unit (i), also referred to as the first value of SOP(i). $I_{ESS}$ is the final optimized value of $SOP_{ESS}$ ($SOP_{ESS}^{final}$), used for loading the ESS such that the load distribution is optimal and neither of the battery units receives a load exceeding its maximum load ability. Finally, $I_{ESS}^{max}$ is the maximum load ability of the ESS, also referred to as $SOP_{ESS}^{prel}$, which is calculated in step c) of the method according to the present invention.

As mentioned above, the method of the present invention starts with step a), wherein a first value of SOP(i) of each battery unit (i) is predicted independently using single battery model. The first value of SOP(i) is predicted as if the battery unit (i) was not connected to any other battery units.

Single Battery Model

Each individual battery unit (i) modelled by equivalent circuit as shown in FIG. 1 above has the following main elements:

Internal Ohmic resistance $R_{0i}$ that is a nonlinear function of SoC and temperature Fast dynamic activation polarization modelled by RC pair $R_{1i}$ and $C_{1i}$ which are nonlinear functions of SoC, temperature, and input current $I_i$ Slow dynamic concentration polarization modelled by RC pair $R_{2i}$ and $C_{2i}$ which are nonlinear functions of SoC, temperature, and input current $I_i$ Open-circuit-voltage $V_{OCi}$ that is a nonlinear function of SoC and temperature The electro-thermal dynamics of any individual battery unit (i) within ESS can be represented on the following standard discrete-time state-space form:

$$V_{1i}(k+1) = a_{1i}(k) \cdot V_{1i}(k) + b_{1i}(k) \cdot I_i(k)$$

$$V_{2i}(k+1) = a_{2i}(k) \cdot V_{2i}(k) + b_{2i}(k) \cdot I_i(k)$$

$$SoC_i(k+1) = SoC_i(k) + b_{3i}(k) \cdot I_i(k)$$

$$V_i(k) = V_{oci}(k) + V_{1i}(k) + V_{2i}(k) + R_{0i}(k) \cdot I_i(k)$$

Here $$a_{1i}(k) = e^{-\frac{\Delta T}{\tau_{1i}(k)}}$$

where $\tau_{1i}(k) = R_{1i}(k) \cdot C_{1i}(k)$ is a fast varying time-constant and $\Delta T$ is sampling period $$a_{2i}(k) = e^{-\frac{\Delta T}{\tau_{2i}(k)}}$$

where $\tau_{2i}(k) = R_{2i}(k) \cdot C_{2i}(k)$ is a slow varying time-constant $$b_{1i}(k) = R_{1i}(k) \cdot [1 - a_{1i}(k)],$$

$$b_{2i}(k) = R_{2i}(k) \cdot [1 - a_{2i}(k)],$$

$$b_{3i}(k) = \frac{\eta \cdot \Delta T}{3600 \cdot Q_i(k)}$$

where $Q_{bi}$ and $\eta$ are battery capacity and columbic efficiency, $V_{oci}(k) = f_{ocv}(SoC(k))$ gives open-circuit voltage as a function of battery SoC.

Note that $$R_{0i}(k) = f_{R0i}(SoC_i(k), T_i(k)),$$

$$R_{1i}(k) = f_{R1i}(SoC_i(k), T_i(k), I_i(k)),$$

$$C_{1i}(k) = f_{C1i}(SoC_i(k), T_i(k), I_i(k)),$$

$$R_{2i}(k) = f_{R2i}(SoC_i(k), T_i(k), I_i(k)), \text{ and}$$

$$C_{2i}(k) = f_{C2i}(SoC_i(k), T_i(k), I_i(k))$$

are nonlinear functions of battery SoC, temperature, and input current. The battery temperature dynamics is given by:

$$\dot{T}_i(t) = -a_{ti} \cdot T_i(t) + b_{ti} \cdot U_{hi}(t)$$

where $U_{hi}(t) = I_i \cdot (V_{oci} - V_i)$ is the total heat generation in the battery, $T_{fi}$ is the coolant temperature, and $a_{ti}$ and $b_{ti}$ are thermal constants that depends on heat capacity, thermal resistance, and heat transfer properties of coolant.

Figure 3:
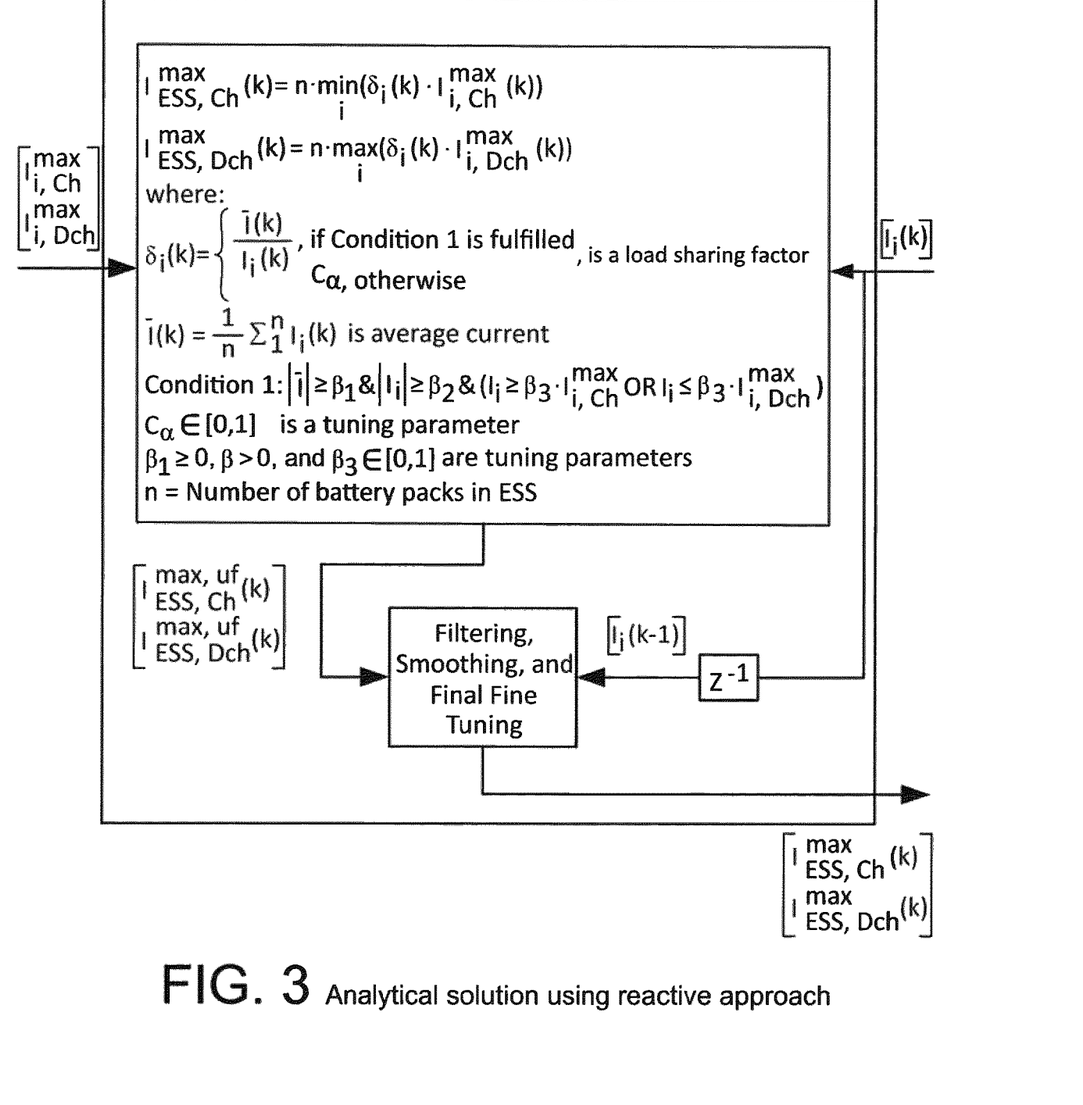
FIG. 3 is a model of analytical solution using reactive approach.
Figure 4:
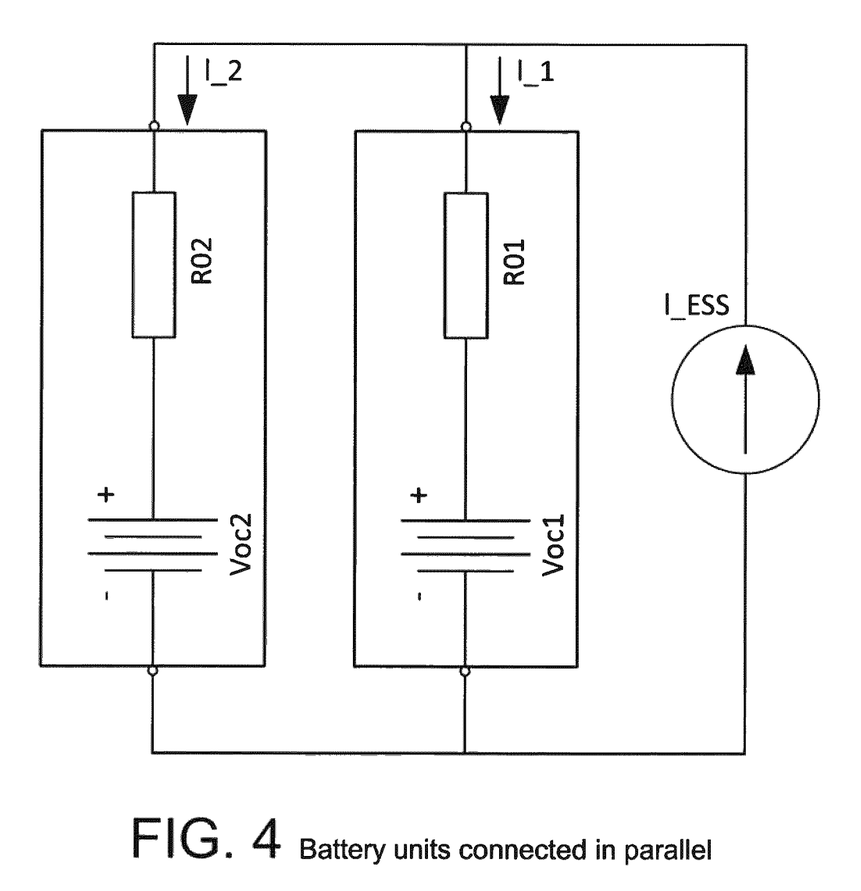
FIG. 4 depicts battery units connected in parallel.

As mentioned above, the first value of SOP(i) is denoted as $I_{Bi,Ch}^{max}, I_{Bi,Dch}^{max}$, and is in the particular embodiments in FIGS. 1, 3 and 4 the maximum charge current ability and maximum discharge current ability of the battery unit (i).

In the next step b), a measured load value L(i) of each battery unit (i) is obtained. As mentioned above, the measured load value L(i) of each battery unit (i) may be either of $I_i$, $V_i$, $SOC_i$, $T_i$ in FIG. 1. Also, the measured load value is denoted as $[I_{Bi}(k)]$ in FIG. 3 and $I_{Bi}(k)$, $V_{Bi}(k)$, $SOC_{Bi}(k)$, $T_{Bi}(k)$ in FIG. 4. It should be noted that (k) denotes a time instant k.

In the next step c), a first value of $SOP_{ESS}$ ($SOP_{ESS}^{prel}$) of said ESS is calculated. As mentioned above, the first value of $SOP_{ESS}$ ($SOP_{ESS}^{prel}$) is calculated as a priori estimate using an analytical solution, that uses as input said first value of SOP(i) of each battery unit (i) and said measured load value L(i) of each battery unit (i). $SOP_{ESS}^{prel}$ is denoted as $I_{ESS,Ch}^{max}, I_{ESS,Dch}^{max}$ in FIGS. 1, 3 and 4. When using the analytical solution, a model predictive approach or reactive approach may be used.

In the embodiment shown in FIG. 3, the reactive approach is illustrated. The calculation of $I_{ESS}^{max}$ is described above.

As may be seen in FIG. 3, the analytical solution comprising the reactive approach also comprises filtering, smoothing and final fine tuning. In this step, a mathematical delay parameter $z^{-1}$ is used, delivering the measured load value, in this example being the measured current, at the time instant k−1, i.e. the instant immediately preceding the time instant k. In other words, the method receives a feedback in terms of the load distribution between the battery units when the ESS has been loaded according to the calculated value of $I_{ESS,Ch}^{max}(k-1), I_{ESS,Dch}^{max}(k-1)$.

Attention is now turned to the analytical solution using zero-order multi-battery model. FIG. 4 illustrates two battery units connected in parallel. For two battery units, the currents are calculated as:

$$I_1 = \frac{R_{02}}{R_{01} + R_{02}} \cdot I_{ESS} + \frac{1}{R_{01} + R_{02}} \cdot (V_{OC2} - V_{OC1})$$

$$I_2 = \frac{R_{01}}{R_{01} + R_{02}} \cdot I_{ESS} + \frac{1}{R_{01} + R_{02}} \cdot (V_{OC1} - V_{OC2})$$

wherein the first term is the current component due to resistance imbalance, and the second term is the current component due to OCV imbalance. $I_{B1}$ and $I_{B2}$ correspond to predicted values of SOP(1) and SOP(2).

For three battery units, the current through each battery unit is calculated as:

$$I_1 = \frac{R_{02} R_{03}}{\theta} \cdot I_{ESS} + \frac{R_{03}}{\theta} \cdot (V_{OC2} - V_{OC1}) + \frac{R_{02}}{\theta} \cdot (V_{OC3} - V_{OC1})$$

$$I_2 = \frac{R_{01} R_{03}}{\theta} \cdot I_{ESS} + \frac{R_{03}}{\theta} \cdot (V_{OC1} - V_{OC2}) + \frac{R_{01}}{\theta} \cdot (V_{OC3} - V_{OC2})$$

$$I_3 = \frac{R_{01} R_{02}}{\theta} \cdot I_{ESS} + \frac{R_{02}}{\theta} \cdot (V_{OC1} - V_{OC3}) + \frac{R_{02}}{\theta} \cdot (V_{OC2} - V_{OC3})$$

wherein $\theta = R_{01} R_{02} + R_{01} R_{03} + R_{02} R_{03}$

For n battery units, the current through each battery unit is calculated as:

$$I_k = \frac{1}{\theta} \prod_{\substack{i \neq k}}^{n} R_{0i} \cdot I_{ESS} + \frac{1}{\theta} \sum_{\substack{i \neq k \\ j \neq i \\ j \neq k}}^{n} (R_{0j} \cdot (V_{OCi} - V_{OCk}))$$

$$S = C(R, n-1) = \binom{R}{n-1}$$

$$\theta = \sum_{S_i \in S} s_i$$

Once the values of currents though each battery unit are calculated, i.e. the load distribution is predicted, $SOP_{ESS}^{prel}$, denoted as $I_{ESS}^{max}$, may be calculated, such that $I_{i,Dch}^{max} \leq I_i \leq I_{i,Ch}^{max}$, i.e such that the predicted load value of the battery unit (i) does not violate the predicted maximum load ability of that battery unit.

Figure 5:
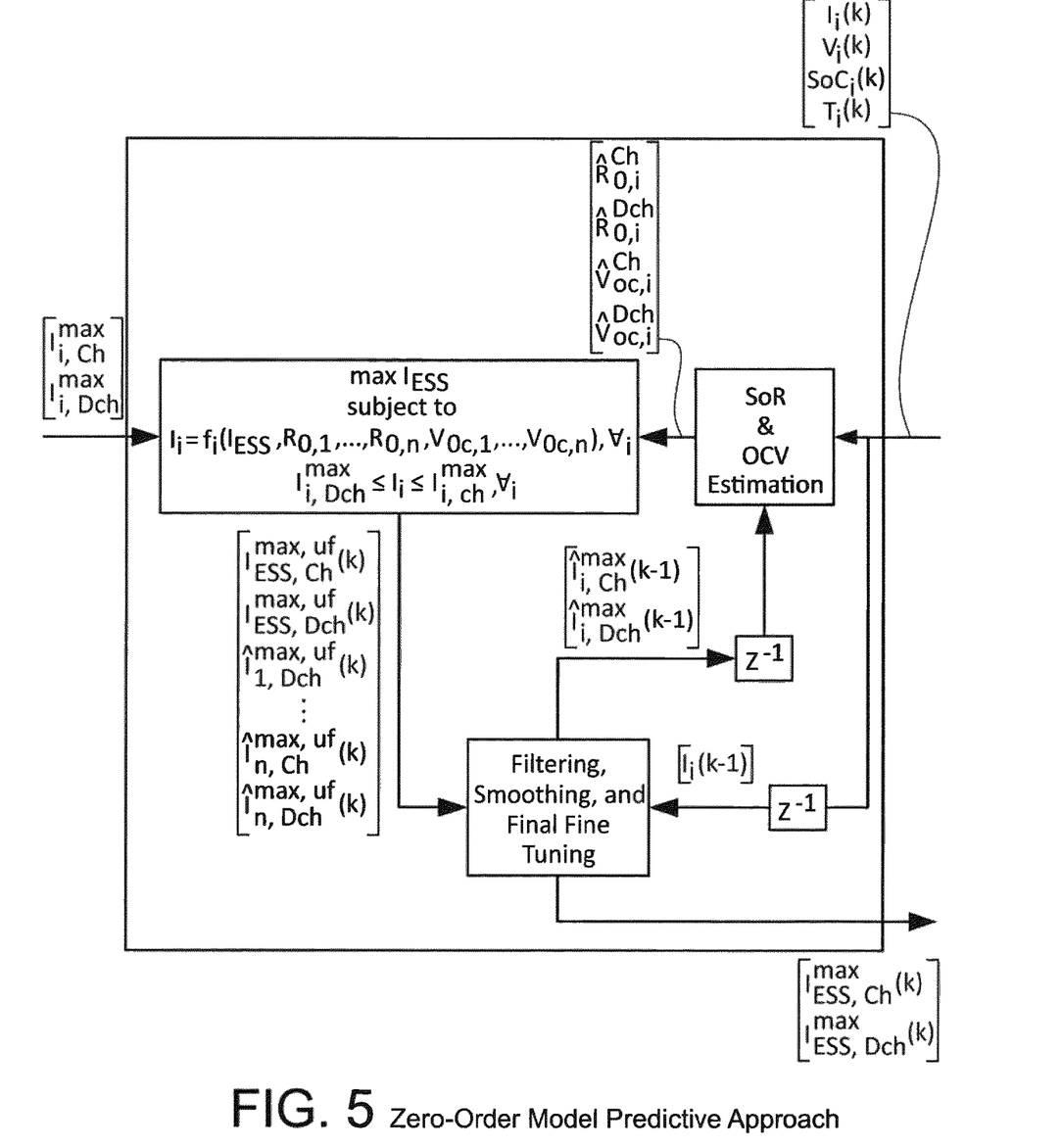
FIG. 5 is a model of zero-order model predictive approach.

It must be noted that in zero-order multi-battery model illustrated in FIG. 5, there is circular dependency present. Indeed, the ohmic resistance value $R_{0,i}$ of each battery unit is dependent on load, while the load is calculated using the value of ohmic resistance $R_{0i}$, as was shown above. In order to address this circular dependency, the method includes two mathematical delay parameters. First, the load distribution from the time instant k−1, being immediately preceding the time instant k, is obtained and used as input in filtering, smoothing and final fine tuning ($I_i(k-1)$). Further, the predicted SOP(i) values from the time instant k−1, denoted as $I_{i,Dch}^{max}(k-1)$, $I_{i,Ch}^{max}(k-1)$ are used as input for SOR and OCV estimation.

Thus, the analytical solution using model predictive approach provides a very accurate estimate of the first value of $SOP_{ESS}$ ($SOP_{ESS}^{prel}$). These equations can be solved for maximum $I_{ESS}$ (i.e., maximum charge $I_{ESS,Ch}^{max}$ or maximum discharge $I_{ESS,Ch}^{max}$ current abilities) for given maximum charge/discharge current abilities SOP(i) (i.e., $I_{i,Ch}^{max}$ and $I_{i,Dch}^{max}$) for each battery unit (i)". This leads to linear programming problem, but it has a very simple analytical solution in terms of two equations given below:

$$I_{ESS,Ch}^{max} = \sum_{i=1}^{n} \frac{1}{R_{0j}} \cdot \min\left((R_{01} I_{1,Ch}^{max} + V_{oc1}), \ldots, (R_{0n} I_{n,Ch}^{max} + V_{ocn})\right) - \sum_{i=1}^{n} \frac{V_{oci}}{R_{oi}}$$

$$I_{ESS,Dch}^{max} = \sum_{i=1}^{n} \frac{1}{R_{0j}} \cdot \max\left((R_{01} I_{1,Dch}^{max} + V_{oc1}), \ldots, (R_{0n} I_{n,Dch}^{max} + V_{ocn})\right) - \sum_{i=1}^{n} \frac{V_{oci}}{R_{oi}}$$

As mentioned above, the first value of $SOP_{ESS}$ ($SOP_{ESS}^{prel}$) may be used for loading the ESS, or may be further optimized by using the full-order multi-battery model.

Figure 6:
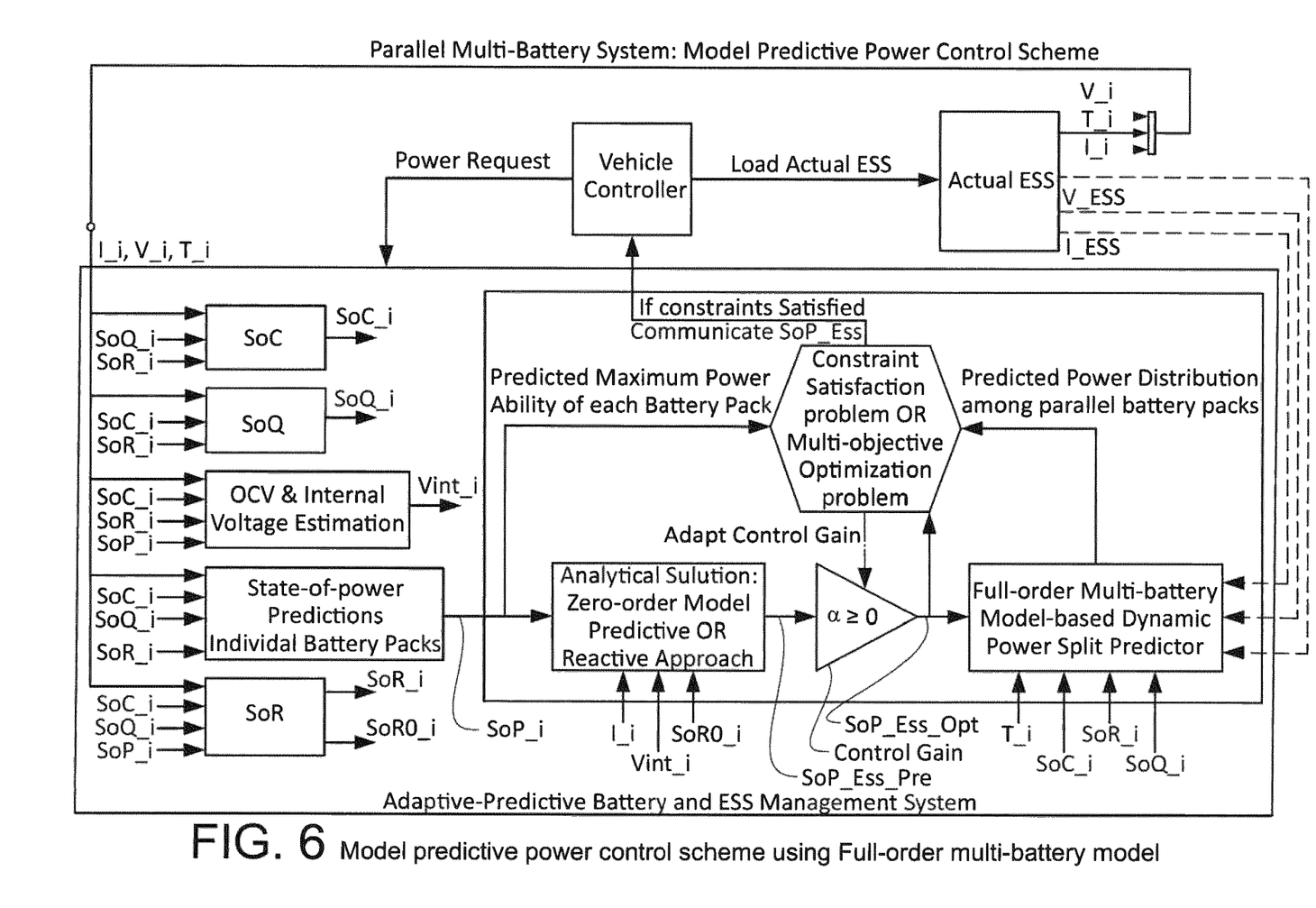
FIG. 6 is a model predictive power control scheme using analytical solution and full-order multi-battery model $\mathbf{x}$.

FIG. 6 illustrates a model predictive power control scheme using analytical solution and full-order multi-battery model. As may be seen, the first value of $SOP_{ESS}$ ($SOP_{ESS}^{prel}$) calculated using the analytical solution as described above according to step c), is used as an initial value of the $SOP_{ESS}$ ($SOP_{ESS}^{prel}$).

In the next step e), a first value of an optimization parameter α is set. The first value of the optimization parameter α is greater than 0. The first value of the optimization parameter α is used for calculating a second value of $SOP_{ESS}$ ($SOP_{ESS}^{opt}$), wherein:

$$SOP_{ESS}^{opt} = \alpha \cdot SOP_{ESS}^{prel}$$

If the first value of the optimization parameter α is set to 1, then the first value of $SOP_{ESS}$ is equal to the second value of $SOP_{ESS}$, i.e.

$$SOP_{ESS}^{opt} = SOP_{ESS}^{prel}$$

In FIG. 6, the second value of $SOP_{ESS}$ ($SOP_{ESS}^{opt}$) is denoted SOP_ESS.

In the step g), a load distribution between the battery units is predicted using a full-order multi-battery model using as input the second value of $SOP_{ESS}$ ($SOP_{ESS}^{opt}$) and obtaining as output a predicted load value L(i) of each battery unit.

Full-Order Parallel Multi-Battery Model

Figure 7:
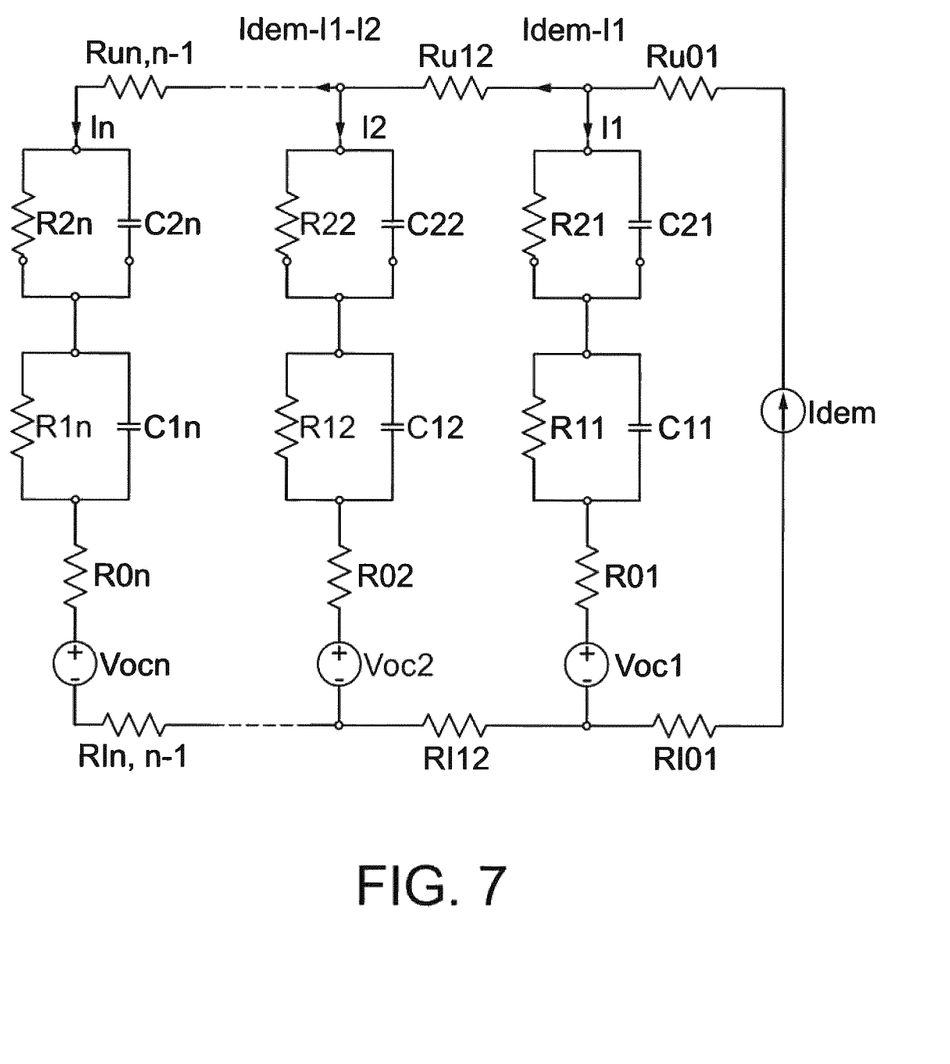
FIG. 7 illustrates a representation of a parallel configuration of battery modules.

Parallel configuration of battery modules may be represented as ✗ illustrated in FIG. 7.

Total connection resistance is calculated as:

$$R_{ci-1,i} = Ru_{i-1,i} + Rl_{i-1,i} \, \forall i \in \{1, \ldots, N\}$$

where $Ru_{i-1,i}$ is the positive path connection resistance between $BU_i$ and $BU_{i-1}$ and $Rl_{i-1,i}$ is the negative path connection resistance between $BU_i$ and $BU_{i-1}$. Constraints imposed by parallel connection are:

$$I_{dem} = \sum_{i}^{n} I_i$$

$$V_i = V_{i-1} - \left(I_{ESS} - \sum_{j=1}^{i-1} I_j\right) \cdot R_{ci-1,i}$$

Complete state-space model of parallel multi-battery system (derived mainly using single battery model and exploiting parallel connection constraints given above) is stated below.

$$\dot{x}(t) = A_f(t) \cdot x(t) + B_f(t) \cdot u(t)$$

$$y(t) = C_f(t) \cdot x(t) + D_f(t) \cdot u(t)$$

Here state $x = [x_1 \ldots x_n]^T$ is the full state vector of complete ESS whereas $x_i = [V_{1i} \, V_{2i} \, V_{oci} \, SoC_i \, T_i]^T$ is the state of its each constituent battery unit $BU_i$. The output of the system is represented by $y = [I_1 \ldots I_n]^T$ where $I_i$ is the output current of each $BU_i$. The control input of this state-space model is given by $u = [I_{ESS} \, U_{h,1} \ldots U_{h,n}]^T$ where $I_{ESS}$ is the total demanded input current and $U_{heat,i}$ is the total heat generated inside $BU_i$. The system matrix $A_f$, input matrix $B_f$, output matrix $C_f$, and feedthrough matrix $D_f$ are nonlinear functions of system parameters ($R_{0i}$, $R_{1i}$, $R_{2i}$, $C_{1i}$, $C_{2i}$, $Q_i$, $R_{ci-1,i}$, $R_{ci}$) and system electro-thermal and ageing states ($SoC_i$, $T_i$, $SoQ_i$, $SoR_i$). Note that compared to single battery model, it was necessary to include open-circuit voltage $V_{oci}$ of each battery pack as an additional state to derive complete model for parallel multi-battery system.

For example, the matrices of this model for n=2 are shown below for better understanding.

The state vector of ESS with two battery units is given by:

$$x = \begin{bmatrix} x_1 \\ x_2 \end{bmatrix}, \quad x_1 = \begin{bmatrix} V_{11} \\ V_{21} \\ Voc_1 \\ SoC_1 \\ T_1 \end{bmatrix}, \quad x_2 = \begin{bmatrix} V_{12} \\ V_{22} \\ Voc_2 \\ SoC_2 \\ T_2 \end{bmatrix}$$

The input vector is given by $$u = \begin{bmatrix} I_{ESS} \\ U_{heat,1} \\ U_{heat,2} \end{bmatrix}$$

The output vector is given by:

$$y = \begin{bmatrix} I_1 \\ I_2 \end{bmatrix}$$

The system matrix is given by:

$$A_I = \begin{bmatrix} A_{I,11} & A_{I,12} \\ A_{I,21} & A_{I,22} \end{bmatrix}$$

$$A_{I,11} = \frac{1}{\Omega} \cdot \begin{bmatrix} \frac{R_{01}+R_{02}+R_{11}+R_{c12}}{R_{11}C_{11}} & \frac{1}{C_{11}} & \frac{1}{C_{11}} & 0 & 0 \\ \frac{1}{C_{21}} & \frac{R_{01}+R_{02}+R_{21}+R_{c12}}{R_{21}C_{21}} & \frac{1}{C_{21}} & 0 & 0 \\ \frac{1}{C_{01}} & \frac{1}{C_{01}} & \frac{1}{C_{01}} & 0 & \Omega \cdot a_{t1} \frac{\partial V_{oc1}}{\partial T_1} \\ \frac{\eta_1}{3600Q_1} & \frac{\eta_1}{3600Q_1} & \frac{\eta_1}{3600Q_1} & 0 & 0 \\ 0 & 0 & 0 & 0 & \Omega \cdot a_{t1} \end{bmatrix}$$

$$A_{I,22} = \frac{1}{\Omega} \cdot \begin{bmatrix} \frac{R_{01}+R_{02}+R_{12}+R_{c12}}{R_{12}C_{12}} & \frac{1}{C_{12}} & \frac{1}{C_{12}} & 0 & 0 \\ \frac{1}{C_{22}} & \frac{R_{01}+R_{02}+R_{12}+R_{c12}}{R_{22}C_{22}} & \frac{1}{C_{22}} & 0 & 0 \\ \frac{1}{C_{02}} & \frac{1}{C_{02}} & \frac{1}{C_{02}} & 0 & \Omega \cdot a_{t2} \frac{\partial V_{oc2}}{\partial T_2} \\ \frac{\eta_1}{3600Q_2} & \frac{\eta_1}{3600Q_2} & \frac{\eta_1}{3600Q_2} & 0 & 0 \\ 0 & 0 & 0 & 0 & \Omega \cdot a_{t2} \end{bmatrix}$$

$$A_{I,12} = -\frac{1}{\Omega} \cdot \begin{bmatrix} \frac{1}{C_{11}} & \frac{1}{C_{11}} & \frac{1}{C_{11}} & 0 & 0 \\ \frac{1}{C_{21}} & \frac{1}{C_{21}} & \frac{1}{C_{21}} & 0 & 0 \\ \frac{1}{C_{01}} & \frac{1}{C_{01}} & \frac{1}{C_{01}} & 0 & 0 \\ \frac{\eta_1}{3600Q_1} & \frac{\eta_1}{3600Q_1} & \frac{\eta_1}{3600Q_1} & 0 & 0 \\ 0 & 0 & 0 & 0 & 0 \end{bmatrix}$$

$$A_{I,21} = -\frac{1}{\Omega} \cdot \begin{bmatrix} \frac{1}{C_{12}} & \frac{1}{C_{12}} & \frac{1}{C_{12}} & 0 & 0 \\ \frac{1}{C_{22}} & \frac{1}{C_{22}} & \frac{1}{C_{22}} & 0 & 0 \\ \frac{1}{C_{02}} & \frac{1}{C_{02}} & \frac{1}{C_{02}} & 0 & 0 \\ \frac{\eta_2}{3600Q_2} & \frac{\eta_2}{3600Q_2} & \frac{\eta_2}{3600Q_2} & 0 & 0 \\ 0 & 0 & 0 & 0 & 0 \end{bmatrix}$$

where $\Omega = R_{01}+R_{02}+R_{c12}$ is the accumulated resistance. Note that $$\frac{\partial V_{OC1}}{\partial T_1}$$

and $$\frac{\partial V_{OC2}}{\partial T_2}$$

(jacobians of OCVs of batteries with respect to their temperatures) are treated as parameters in this model. They are typically stored as look-up tables in computer memory.

The input matrix is given by:

$$B_I = \begin{bmatrix} B_{I,1} \\ B_{I,2} \end{bmatrix}$$

-continued $$B_{I,1} = \frac{1}{\Omega}\begin{bmatrix} \frac{R_{02}+R_{c12}}{C_{11}} & 0 & 0 \\ \frac{R_{02}+R_{c12}}{C_{21}} & 0 & 0 \\ \frac{R_{02}+R_{c12}}{C_{01}} & \Omega\frac{\partial V_{oc1}}{\partial T_1} & 0 \\ \frac{\eta_1 \cdot (R_{02}+R_{c12})}{3600Q_1} & 0 & 0 \\ 0 & \Omega \cdot b_{t1} & 0 \end{bmatrix},$$

$$B_{I,2} = \frac{1}{\Omega_1}\begin{bmatrix} \frac{R_{01}}{C_{12}} & 0 & 0 \\ \frac{R_{01}}{C_{22}} & 0 & 0 \\ \frac{R_{01}}{C_{02}} & 0 & \Omega\frac{\partial V_{oc2}}{\partial T_2} \\ \frac{\eta_2 \cdot R_{01}}{3600Q_1} & 0 & 0 \\ 0 & 0 & \Omega \cdot b_{t2} \end{bmatrix}$$

The output matrix is given by:

$$C_I = \frac{1}{\Omega}\begin{bmatrix} -1 & -1 & -1 & 0 & 0 & 1 & 1 & 1 & 0 & 0 \\ 1 & 1 & 1 & 0 & 0 & -1 & -1 & -1 & 0 & 0 \end{bmatrix}$$

The direct feedthrough matrix is given by:

$$D_I = \frac{1}{\Omega}\begin{bmatrix} R_{02}+R_{c12} & 0 & 0 \\ R_{01} & 0 & 0 \end{bmatrix}$$

Note that how various system parameters including battery impedances, capacities, cable connection resistances, temperatures etc enter into this model through these matrices. This enables prediction of power/current split between batteries with higher accuracy under given operating conditions.

Next, the constraint satisfaction problem or multi-objective optimization problem is iteratively solved in step h), using as input the first value of SOP(i) and the predicted load value $\hat{L}(i)$ and obtaining as output a third value of $SOP_{ESS}$ ($SOP_{ESS}^{final}$), wherein iterations occur until the first value of SOP(i), being in FIG. 6 denoted as predicted maximum power ability of each battery pack, is greater than or equal to the predicted load value $\hat{L}(i)$, in FIG. 6 denoted as predicted power distribution among parallel battery packs. At each iteration, a second value of the optimization parameter α is obtained and used for calculating a new second value of $SOP_{ESS}$ ($SOP_{ESS}^{opt}$). If the predicted load value L(i) is greater than the first value of SOP(i), it means that the battery unit (i) will receive current or power exceeding the maximum allowed value of current or power of this battery unit. Therefore, iterations occur until the first value of SOP(i) is greater than or equal to the predicted load value $\hat{L}(i)$.

According to a particular embodiment, the charge current $\hat{I}(i)$ through each battery unit in the ESS for the second value of $SOP_{ESS}$ ($SOP_{ESS}^{opt}$) is predicted using the full-order multi-battery model. The predicted value $\hat{I}(i)$ for each battery unit is compared with the corresponding maximum charge current for this battery unit, $I_{max}(i)$, thus obtaining a value of $I_{diff}(i)$, wherein:

$$I_{diff}(i) = \hat{I}(i) - I_{max}(i)$$

The output of step h) is thus an $I_{diff}$ vector with n elements, where n is the total number of battery units, and element $I_{diff}(i)$ contains a positive or negative value, indicating whether the predicted charge current exceeds the maximum charge power/current capability of battery unit (i).

If at least one of the values in the $I_{diff}$ vector is positive, i.e. $I_{diff}(i) \geq 0$, the steps e)-h) are repeated, setting a different value of optimization parameter α in step e). The process continues iteratively, adapting the value of optimization parameter α in each iteration, until all the values in the $I_{diff}$ vector are negative, i.e. when none of the predicted charge current values $\hat{I}(i)$ exceeds maximum allowed charge current value $I_{max}(i)$ for the battery unit (i).

Once the constraint satisfaction problem is solved and the third value of $SOP_{ESS}$ ($SOP_{ESS}^{final}$) is calculated, steps i)-j) are executed, communicating the third value of $SOP_{ESS}$ ($SOP_{ESS}^{final}$) value to the vehicle controller and loading the ESS according to the third value of $SOP_{ESS}$ ($SOP_{ESS}^{final}$).

The control functionality of the example embodiments may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

It is to be understood that the present invention is not limited to the embodiments described above and illustrated in the drawings; rather, the skilled person will recognize that many changes and modifications may be made within the scope of the appended claims. For example, although the present invention has mainly been described in relation to an electrical bus, the invention should be understood to be equally applicable for any type of electrical vehicle.

The invention claimed is:

1. A method for management of an energy storage system of a vehicle, wherein said vehicle comprises a vehicle control unit and an energy storage control management unit, wherein said energy storage system comprises at least two battery units electrically connected in parallel to each other, said method comprising the steps of:
   a) predicting a first value of a state of power of each battery unit independently using a single battery model;

b) obtaining a measured load value of each battery unit, wherein said measured load value of each battery unit is current or power, and therefrom calculating a load sharing factor of each battery unit;

c) calculating a first value of a state of power of said energy storage system using an analytical solution that uses as input a product of: said first value of said state of power and said load sharing factor, of each battery unit.

2. The method according to claim 1, wherein calculating the first value of a state of power of said energy storage system using an analytical solution comprises determining the product of said first value of said state of power of each battery unit and said load sharing factor of each battery unit being closest to zero.

3. The method according to claim 1, wherein said first value of said state of power of said energy storage system is calculated using a model predictive approach, said model predictive approach utilizes zero-order multi-battery model.

4. The method according claim 3, wherein said zero-order multi-battery model uses as input the following parameters:
   current of each battery unit,
   an internal open circuit battery voltage of each battery unit,
   ohmic resistance for each battery unit.

5. The method according to claim 1, wherein said first value of said state of power of said energy storage system is calculated using reactive approach.

6. The method according to claim 1, wherein said first value of said state of power of said energy storage system is maximum charge current ability of said energy storage system, and maximum discharge current ability of said energy storage system.

7. The method according to claim 1, wherein said first value of said state of power of each battery unit is predicted charge/discharge current or predicted charge/discharge power.

8. The method according to claim 1, said method comprising a step of:
   d) loading said energy storage system according to said first value of said state of power of said energy storage system.

9. The method according to claim 1, wherein said method further comprises the steps of:
   e) setting a first value of an optimization parameter $\alpha$;
   f) calculating a second value of said state of power of said energy storage system based on said first value of said optimization parameter $\alpha$ and using as input said first value of said state of power of said energy storage system;
   g) predicting a load distribution between said at least two battery units using a full-order multi-battery model using as input said second value of said state of power of said energy storage system and obtaining as output a predicted load value of each battery unit;
   h) iteratively solving constraint satisfaction problem or multi-objective optimization problem, using as input said first value of said state of power and said predicted load value said state of power and obtaining as output a third value of said state of power of said energy storage system, wherein iterations occur until a certain criterion is fulfilled, and wherein at each iteration a second value of said optimization parameter $\alpha$ is obtained and used for calculating a new second value of said state of power of said energy storage system to be used in step g);
   i) communicating said third value of said state of power of said energy storage system to said vehicle controller;
   j) loading the energy storage system according to said third value of said state of power of said energy storage system.

10. The method according to claim 9, wherein said method further comprises the steps of:
   k) receiving at least one operational parameter from the energy storage system after loading said energy storage system according to said third value of said state of power of said energy storage system;
   l) using said at least one operational parameter as input in said full-order multi-battery model.

11. The method according to claim 1, wherein said first value of said state of power of each battery unit independently in step a) is obtained using as input the following data measured in each battery unit:
   current;
   voltage;
   temperature;
   state of charge;
   state of current, and
   state of resistance.

12. The method according to claim 1, wherein said certain criterion is that said first value of said state of power of at least one battery unit is equal to maximum of its predicted load value over given prediction horizon.

13. The method according claim 1, wherein the method further comprises the step of:
   a0) receiving a power request from the vehicle control unit;
   wherein step a0 occurs before step a).

14. The method according to claim 1, in which the method is performed by said energy storage control management unit during use of the energy storage system by the vehicle.

15. A non-transitory computer readable medium carrying a computer program comprising program code for performing the steps of claim 1 when said program code is run on a computer.

16. An energy storage control management unit configured to perform any one of the steps of claim 1.

17. An adaptive battery management system for an energy storage system of a vehicle, wherein said vehicle comprises a vehicle control unit and an energy storage control management unit, said energy storage system comprising at least two battery units connected in parallel, said management system comprising a model for calculating a first value of said state of power of said energy storage system for optimal loading of said energy storage system, wherein the model is configured to:
   a) predict a first value of a state of power of each battery unit independently;
   b) obtain a measured load value of each battery unit, wherein said measured load value of each battery unit is current or power, and therefrom calculating a load sharing factor of each battery unit;
   c) calculate a first value of a state of power of said energy storage system using an analytical solution that uses as input a product of: said first value of said state of power and said load sharing factor, of each battery unit.

18. The battery management system according to claim 17, wherein said at least two battery units are any one of a lithium-ion battery or sodium-ion battery packs.

19. A vehicle, comprising an adaptive battery management system according to claim 17.

* * * * *